(12) United States Patent
Tchakarov et al.

(10) Patent No.: US 9,099,673 B2
(45) Date of Patent: Aug. 4, 2015

(54) ELECTRODE FOR AN ORGANIC LIGHT-EMITTING DEVICE, ACID ETCHING THEREOF AND ALSO ORGANIC LIGHT-EMITTING DEVICE INCORPORATING IT

(75) Inventors: Svetoslav Tchakarov, Arcueil (FR); Pascal Reutler, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 347 days.

(21) Appl. No.: 12/515,200

(22) PCT Filed: Nov. 16, 2007

(86) PCT No.: PCT/FR2007/052360
§ 371 (c)(1),
(2), (4) Date: May 15, 2009

(87) PCT Pub. No.: WO2008/059185
PCT Pub. Date: May 22, 2008

(65) Prior Publication Data
US 2010/0225227 A1 Sep. 9, 2010

(30) Foreign Application Priority Data
Nov. 17, 2006 (FR) ...................... 06 54952

(51) Int. Cl.
*H01L 51/50* (2006.01)
*H01L 51/52* (2006.01)
(Continued)

(52) U.S. Cl.
CPC ............ *H01L 51/5215* (2013.01); *C03C 17/36* (2013.01); *C03C 17/3618* (2013.01); *C03C 17/3626* (2013.01); *C03C 17/3652* (2013.01); *C03C 17/3668* (2013.01);
(Continued)

(58) Field of Classification Search
None
See application file for complete search history.

(56) References Cited

U.S. PATENT DOCUMENTS

| 4,649,432 A | 3/1987 | Watanabe et al. |
| 5,280,373 A | 1/1994 | Ozawa et al. |

(Continued)

FOREIGN PATENT DOCUMENTS

| DE | 197 33 053 | 2/1999 |
| DE | 20 2005 000 979 | 7/2006 |

(Continued)

OTHER PUBLICATIONS

U.S. Appl. No. 12/440,301, filed Mar. 6, 2009, Tchakarov, et al.
(Continued)

*Primary Examiner* — Fei Fei Yeung Lopez
(74) *Attorney, Agent, or Firm* — Oblon, McClelland, Maier & Neustadt, L.L.P.

(57) ABSTRACT

The subject of the present invention is a multilayer electrode (3), acid etching thereof and also organic light-emitting devices incorporating it. The multilayer electrode, known as a lower electrode for an organic light-emitting device (10), successively comprises: —a contact layer (31) based on a metal oxide and/or a metal nitride; a functional metallic layer (32) having intrinsic electrical conductivity properties; a thin blocking layer (32) directly on the functional layer, the layer comprising a metallic layer having a thickness less than or equal to 5 nm and/or a layer with a thickness less than or equal to 10 nm, which is based on a substoichiometric metal oxide, substoichiometric metal oxynitride or substoichiometric metal nitride; a coating comprising an overlayer based on a metal oxide (34) for adapting the work function.

29 Claims, 4 Drawing Sheets

(51) Int. Cl.
*C03C 17/36* (2006.01)
*H01L 27/32* (2006.01)

(52) U.S. Cl.
CPC ....... *C03C 17/3671* (2013.01); *H01L 51/5203* (2013.01); *H01L 51/5218* (2013.01); *H01L 51/5234* (2013.01); *C03C 2217/94* (2013.01); *H01L 27/3204* (2013.01)

(56) References Cited

U.S. PATENT DOCUMENTS

| | | | |
|---|---|---|---|
| 5,346,770 A * | 9/1994 | Osada et al. | 428/432 |
| 5,667,853 A | 9/1997 | Fukuyoshi et al. | |
| 5,962,115 A | 10/1999 | Zmelty et al. | |
| 6,014,196 A | 1/2000 | Anzaki et al. | |
| 6,040,056 A | 3/2000 | Anzaki et al. | |
| 6,045,896 A | 4/2000 | Boire et al. | |
| 6,414,431 B1 | 7/2002 | Yu et al. | |
| 6,489,045 B1 | 12/2002 | Araki et al. | |
| 7,049,757 B2 * | 5/2006 | Foust et al. | 315/185 S |
| 7,161,171 B2 | 1/2007 | Dahmani et al. | |
| 2002/0008286 A1 * | 1/2002 | Yamazaki et al. | 257/359 |
| 2002/0036135 A1 * | 3/2002 | Vanderstraeten | 204/298.12 |
| 2003/0049464 A1 | 3/2003 | Glenn et al. | |
| 2003/0162333 A1 | 8/2003 | Kim et al. | 438/151 |
| 2003/0186064 A1 * | 10/2003 | Murata et al. | 428/432 |
| 2004/0001915 A1 | 1/2004 | He et al. | |
| 2004/0031957 A1 | 2/2004 | Tyan | |
| 2004/0032220 A1 | 2/2004 | Cok et al. | |
| 2004/0081855 A1 * | 4/2004 | Kim et al. | 428/690 |
| 2004/0113146 A1 | 6/2004 | Dahmani et al. | |
| 2004/0149984 A1 * | 8/2004 | Tyan et al. | 257/40 |
| 2004/0245918 A1 | 12/2004 | Lee | |
| 2005/0000564 A1 * | 1/2005 | Sato et al. | 136/256 |
| 2005/0073228 A1 | 4/2005 | Tyan et al. | |
| 2005/0073251 A1 | 4/2005 | Kato | |
| 2005/0124257 A1 | 6/2005 | Maeuser | |
| 2005/0162071 A1 * | 7/2005 | Lee et al. | 313/503 |
| 2005/0199904 A1 | 9/2005 | Yamamoto | |
| 2005/0264185 A1 | 12/2005 | Hoffmann | |
| 2006/0043886 A1 * | 3/2006 | Lee et al. | 313/506 |
| 2006/0091791 A1 | 5/2006 | Shin | |
| 2006/0124933 A1 | 6/2006 | Kang | |
| 2006/0152833 A1 | 7/2006 | Halls et al. | |
| 2006/0209551 A1 | 9/2006 | Dchwenke et al. | |
| 2006/0269786 A1 | 11/2006 | Shin et al. | |
| 2006/0290841 A1 * | 12/2006 | Kwon et al. | 349/110 |
| 2007/0206263 A1 | 9/2007 | Neuman et al. | |
| 2007/0252155 A1 * | 11/2007 | Cok | 257/79 |
| 2008/0049431 A1 * | 2/2008 | Boek et al. | 362/311 |
| 2008/0100202 A1 * | 5/2008 | Cok | 313/503 |

FOREIGN PATENT DOCUMENTS

| | | |
|---|---|---|
| EP | 0 733 931 | 9/1996 |
| EP | 0 747 330 | 12/1996 |
| EP | 0 847 965 | 6/1998 |
| EP | 1 329 307 | 7/2003 |
| EP | 1 396 676 | 3/2004 |
| EP | 1 403 939 | 3/2004 |
| EP | 1 521 305 | 4/2005 |
| EP | 1 693 483 | 8/2006 |
| EP | 1 717 876 | 11/2006 |
| FR | 2 844 136 | 3/2004 |
| JP | 10-100303 | 4/1998 |
| JP | 10-217378 | 8/1998 |
| JP | 11-070610 | 3/1999 |
| JP | 2001-243840 | 9/2001 |
| JP | 2002-015623 | 1/2002 |
| JP | 2002-313139 | 10/2002 |
| JP | 2002 313572 | 10/2002 |
| WO | 99 02017 | 1/1999 |
| WO | 2004 057674 | 7/2004 |
| WO | 2005 041620 | 5/2005 |
| WO | 2005 053053 | 6/2005 |
| WO | WO 2006/013373 | 2/2006 |
| WO | WO 2007/096565 | 8/2007 |

OTHER PUBLICATIONS

U.S. Appl. No. 12/527,723, filed Aug. 19, 2009, Tchakarov.
International Search Report issued Mar. 3, 2008 in PCT/FR2007/051876.
International Search Report as received in PCT/FR2007/052360 dated May 28, 2008.
European Search Report as received in corresponding Patent Application No. 11172743.4-1235 dated Sep. 23, 2011.
European Search Report as received in corresponding Patent Application No. 11172737.6-1235 dated Sep. 23, 2011.
Kloeppel, A. et al., "Dependence of the electrical and optical behaviour of ITO-silver-ITO multilayers on the silver properties", Thin Solid Films, Elsevier, vol. 365, No. 1, pp. 139-146, (Apr. 1, 2000).
Jung, Yeon Sik et al., "Effects of thermal treatment on the electrical and optical properties of silver-based indium tin oxide / metal / indium tin oxide structures", Thin Solid Films, Elsevier, vol. 440, No. 1-2, pp. 278-284, (Sep. 1, 2003).
European Search Report as received in corresponding Patent Application No. 11185303.2-1235 dated Dec. 13, 2011.
Written Opinion of the International Searching Authority as received in International Application No. PCT/FR2008/052412, filed Dec. 23, 2008.
U.S. Appl. No. 13/685,028, filed Nov. 26, 2012, Tchakarov, et al.

* cited by examiner

ELECTRODE FOR AN ORGANIC LIGHT-EMITTING DEVICE, ACID ETCHING THEREOF AND ALSO ORGANIC LIGHT-EMITTING DEVICE INCORPORATING IT

The subject of the present invention is a multilayer electrode for an organic light-emitting device, to its acid etching and to an organic light-emitting device incorporating it.

Known organic light-emitting systems or OLEDs comprise an organic light-emitting material or a multilayer coating of organic light-emitting materials supplied with electricity by electrodes generally in the form of two electroconductive layers flanking it.

These electroconductive layers commonly comprise a layer based on indium oxide, generally tin-doped indium oxide known more by the abbreviation ITO. ITO layers have been studied particularly closely. They can be easily deposited by magnetron sputtering, either using an oxide target (nonreactive sputtering) or using a target based on indium and tin (reactive sputtering in the presence of an oxidizing agent of the oxygen type), and their thickness is around 100 to 150 nm. However, this ITO layer has a number of drawbacks. Firstly, the material and the high-temperature (350° C.) deposition process for improving the conductivity generate additional costs. The sheet resistance remains relatively high (of the order of $10\Omega/\square$) unless the thickness of the layers is increased beyond 150 nm, which would result in a reduction in transparency and an increase in the surface roughness.

Thus, new electrode structures are being developed. For example, document JP2005-038642 teaches a TFT (thin-film transistor)-driven light-emitting flat screen comprising top-emitting organic light-emitting systems generating, respectively, red light, green light and blue light, in order to form an active matrix.

Each organic light-emitting device is provided with what is called a rear or bottom electrode comprising:
a contact layer, for example made of ITO;
a (semi)reflective metallic layer, especially based on silver or aluminum, or made of silver containing aluminum, with a thickness of at least 50 nm; and
a work-function-matching overlayer, for example made of ITO.

The object of the invention is to be able to obtain an assembly of electroconductive layers in order to form a reliable electrode which is robust (especially in terms of stability and/or mechanical and thermal resistance) without sacrificing its electroconductivity properties or its optical quality, nor the performance of the device incorporating it, nor generating production difficulties.

The object of the invention is in particular to be able to obtain an assembly of electroconductive layers for forming a bottom electrode of a reliable robust light-emitting system without sacrificing its electroconductivity properties, its optical quality, nor the optical performance of the OLED nor generating production difficulties.

The term "bottom electrode" should be understood within the context of the invention to refer to the electrode closest to the substrate, inserted between the carrier substrate and the OLED system.

Additionally, this objective is to be achieved without upsetting the known configurations of organic light-emitting systems relating to the invention, and for a low cost.

This involves developing electrodes that are essentially transparent, semitransparent (both transparent and reflective) or reflective, and which are suitable equally well for OLEDs forming active-matrix and passive-matrix OLED screens, or used in general (architectural and/or decorative) illumination applications or in indicating applications, or even for other electronic applications.

For this purpose, one subject of the invention is a substrate, for an organic light-emitting device, bearing, on a first main face, a multilayer electrode, called the bottom electrode, which electrode comprises, in succession:
a layer, called contact layer, made of a dielectric material of the metal oxide and/or metal nitride type;
a metallic functional layer having intrinsic electrical conductivity properties;
a thin blocking layer directly on the metallic functional layer, the thin blocking layer comprising a metallic layer with a thickness of 5 nm or less, preferably between 0.5 and 2 nm, and/or comprising a layer with a thickness of 10 nm or less, preferably between 0.5 and 2 nm, and which is based on a substoichiometric metal oxide, substoichiometric metal oxynitride or substoichiometric metal nitride; and
a film comprising an overlayer, made of a metal-oxide-based dielectric material, forming a work-function-matching layer.

The thin blocking layer forms a protective or even a "sacrificial" layer, which prevents impairment of the functional metal, which is especially pure and/or as a thin layer, in one or more of the following configurations:
if the layer that surmounts the functional layer is deposited using a reactive (oxygen, nitrogen, etc.) plasma, for example if the oxide layer that surmounts it is deposited by sputtering;
if the composition of the layer that surmounts the functional layer is liable to vary during industrial fabrication (variation in the deposition conditions, of the target wear type, etc.), especially if the stoichiometry of an oxide and/or nitride type layer varies, therefore modifying the quality of the functional layer and therefore the properties (surface resistance, light transmission, etc.) of the electrode; and
if the electrode undergoes a heat treatment after deposition.

This protective or sacrificial layer significantly improves the reproducibility of the electrical and optical properties of the electrode. This is very important for an industrial approach in which only a small scatter in the properties of the electrodes is acceptable.

The chosen thin metallic blocking layer may preferably consist of a material chosen from at least one of the following metals: Ti, V, Mn, Fe, Co, Cu, Zn, Zr, Hf, Al, Nb, Ni, Cr, Mo, Ta and W, or an alloy based on at least one of these materials.

A thin blocking layer based on a metal chosen from niobium Nb, tantalum Ta, titanium Ti, chromium Cr and nickel Ni, or based on an alloy formed from at least two of these metals, especially a niobium/tantalum (Nb/Ta) alloy, a niobium/chromium (Nb/Cr) alloy or a tantalum/chromium (Ta/Cr) alloy or a nickel/chromium (Ni/Cr) alloy, is particularly preferred. This type of layer based on at least one metal has a particularly strong gettering effect.

A thin metallic blocking layer may be easily fabricated without impairing the functional layer. This metallic layer may preferably be deposited in an inert atmosphere (i.e. into which no oxygen or nitrogen has been intentionally introduced), consisting of a noble gas (He, Ne, Xe, Ar, Kr). It is neither excluded nor is it problematic for this metallic layer to be oxidized on the surface during subsequent deposition of a layer based on a metal oxide.

Such a thin metallic blocking layer also provides excellent mechanical behavior (especially abrasion and scratch resistance). This is especially so for multilayer coatings that undergo a heat treatment, and therefore a substantial diffusion of oxygen or nitrogen.

However, for the use of a metallic blocking layer it is necessary to limit the thickness of the metallic layer and therefore the light absorption in order to retain sufficient light transmission.

The thin blocking layer may be partially oxidized. This layer is deposited in nonmetallic form and is therefore not deposited in stoichiometric form but in substoichiometric form, of the $MO_x$ type, where M represents the material and x is a number smaller than that for stoichiometry of the oxide of the material, or of the $MNO_x$ type for an oxide of two materials M and N (or of more than two). For example, mention may be made of $TiO_x$ and $NiCrO_x$.

Preferably, x is between 0.75 times and 0.99 times the number for normal stoichiometry of the oxide. For a monoxide, x may in particular be chosen to be between 0.5 and 0.98 and for a dioxide x may be between 1.5 and 1.98.

In one particular variant, the thin blocking layer is based on $TiO_x$ in which x may in particular be such that $1.5 \leq x \leq 1.98$ or $1.5 < x < 1.7$, or even $1.7 \leq x \leq 1.95$.

The thin blocking layer may be partially nitrided. It is therefore not deposited in stoichiometric form but in substoichiometric form of the type $MN_y$, where M represents the material and y is a number smaller than that for stoichiometry of the nitride of the material, y being preferably between 0.75 times and 0.99 times the number for normal stoichiometry of the nitride.

Likewise, the thin blocking layer may also be partially oxynitrided.

This thin oxidized and/or nitrided blocking layer may be readily fabricated without impairing the functional layer. It is preferably deposited using a ceramic target in a non-oxidizing atmosphere consisting preferably of a noble gas (He, Ne, Xe, Ar or Kr).

The thin blocking layer may preferably be made of a substoichiometric nitride and/or oxide in order to further increase the reproducibility of the electrical and optical properties of the electrode.

The chosen thin substoichiometric oxide and/or nitride blocking layer may preferably be based on a metal chosen from at least one of the following metals: Ti, V, Mn, Fe, Co, Cu, Zn, Zr, Hf, Al, Nb, Ni, Cr, Mo, Ta, W, or on an oxide of a substoichiometric alloy based on at least one of these materials.

Particularly preferred is a layer based on an oxide or oxynitride of a metal chosen from niobium Nb, tantalum Ta, titanium Ti, chromium Cr or nickel Ni or on an alloy formed from at least two of these metals, especially a niobium/tantalum (Nb/Ta) alloy, a niobium/chromium (Nb/Cr) alloy, a tantalum/chromium (Ta/Cr) alloy or a nickel/chromium (Ni/Cr) alloy.

As substoichiometric metal nitride, it is also possible to choose a layer made of silicon nitride $SiN_x$ or aluminum nitride $AlN_x$ or chromium nitride $CrN_x$ or titanium nitride $TiN_x$ or a nitride of several metals, such as $NiCrN_x$.

The thin blocking layer may have an oxidation gradient, for example $M(N)O_{xi}$, with xi varying, that part of the blocking layer in contact with the functional layer being less oxidized than that part of this layer furthest away from the functional layer, using a particular deposition atmosphere.

The thin blocking layer may also be a multilayer and in particular comprise:

on the one hand, an "interfacial" layer immediately in contact with said functional layer, this interfacial layer being made of a material based on a nonstoichiometric metal oxide, nitride or oxynitride, such as those mentioned above;

on the other hand, at least one layer made of a metallic material, such as those mentioned above, this layer being immediately in contact with said "interfacial" layer.

The interfacial layer may be an oxide, nitride or oxynitride of a metal or metals, present in the optional adjacent metallic layer.

The electrode according to the invention has surface properties that are compatible in particular with organic light-emitting systems as well as having electrical conductivity and/or transparency or reflectivity properties that can be appropriately adjusted, especially by varying in particular the thickness of the metallic functional layer, or even of the other layers and/or the deposition conditions.

For a given organic structure of an OLED device, the electrode of the invention enables the efficiency of the OLED in lm/W to be improved by at least 5 to 10% for a brightness in excess of 500 $cd/m^2$ compared with an ITO electrode.

The electrode according to the invention may have a large area, for example an area of 0.02 $m^2$ or more, or even 0.5 $m^2$ or 1 $m^2$.

Preferably, the film may have a thickness of 20 nm or more, so as to provide an oxygen and/or water barrier and be a monolayer or a multilayer of a simple metal oxide or a doped or undoped mixed metal oxide, rather than a more absorbent and/or insulating nitride layer.

Preferably, an overlayer with an electrical conductivity greater than $10^{-6}$ S/cm or even $10^{-4}$ S/cm is chosen, which overlayer is easily and/or rapidly produced, transparent and inexpensive.

The overlayer may preferably be based on at least one of the following transparent conductive metal oxides:

indium oxide, zinc oxide, tin oxide and mixtures thereof, especially a mixed tin zinc oxide $Sn_xZn_yO_z$, which is generally nonstoichiometric and in an amorphous phase, or a mixed indium tin oxide (ITO) or a mixed indium zinc oxide (IZO).

This type of metal oxide may be typically doped between 0.5 and 5%, and is in particular an S-doped tin oxide or zinc oxide doped with Al (AZO), with Ga (GZO) or with B, Sc or Sb for better stability of the deposition process and/or to further increase the electrical conductivity.

These transparent conductive metal oxides may be superstoichiometric on the surface in order to increase the work function.

The film may consist only of this overlayer with for example a thickness of 15 nm or more, for example between 20 and 150 nm, in order at the same time to provide the oxygen and/or water barrier.

Since this overlayer may preferably be the final layer, it is most particularly preferable to have an overlayer made of ITO, which is stable and makes it possible moreover to retain the existing technologies for the fabrication and optimization of the OLED organic structure.

For economic reasons, if an ITO overlayer is chosen, it is preferable for this to have a thickness of 30 nm or less, especially between 3 nm and 20 nm, and to add an additional subjacent oxygen barrier layer for a combined total thickness preferably equal to or greater than 15 nm, or 30 nm, for example between 30 and 150 nm.

Alternatively, or additionally, the overlayer may be based on at least one of the following substoichiometric metal oxides: molybdenum oxide, nickel oxide, aluminum oxide, titanium oxide, zirconium oxide, tantalum oxide, silicon oxide, silver oxide, gold oxide, platinum oxide or palladium oxide, and may preferably have a thickness of 10 nm or less, for example between 1 and 5 nm.

These metal oxides are chosen to be substoichiometric so as to be sufficiently electroconductive, and thin so as to be sufficiently transparent.

The overlayer may be deposited by a vacuum deposition technique, especially by evaporation or magnetron sputtering, in particular at ambient temperature.

Even more preferably, an overlayer that can be preferably etched with the same etching solution as the contact layer is chosen.

In one design of the invention, to prevent the functional layer from corroding, the electrode may include, between the blocking layer and the overlayer, an oxygen and/or water barrier layer based on a metal oxide, most particularly when the overlayer is thin (less than or equal to 20 nm in thickness), such as an ITO (or IZO-ITO or IZO) overlayer or one made of the aforementioned $NiO_x$-type material.

The barrier layer may preferably be based on at least one of the following metal oxides, differing from the materials of the overlayer: zinc oxide, indium oxide, tin oxide, aluminum oxide, titanium oxide, zirconium oxide, tantalum oxide and silicon oxide.

The metal oxide may be typically doped, between 2 and 5%, and is in particular an S-doped tin oxide or a doped zinc oxide $ZnO_x$ doped with Al (AZO) for better stability or doped with Ga (GZO) in order to increase the conductivity, or else doped with B, Sc or Sb.

The barrier layer may be based on a mixed oxide, especially a mixed tin zinc oxide $Sn_xZn_yO_z$, which is generally nonstoichiometric and in an amorphous phase, or based on a mixed indium tin oxide (ITO) or a mixed indium zinc oxide (IZO).

The barrier layer may be a monolayer or a multilayer. This barrier layer preferably has a thickness (in total) of between 3 and 150 nm and even more preferably between 5 and 100 nm.

Naturally, the addition of this layer dedicated to protection provides greater liberty in the choice of the overlayer chosen solely to have optimum surface properties, especially ways for matching the work function in the case of OLEDs.

Preferably, an easily and/or rapidly produced transparent barrier layer is chosen, especially a doped or undoped layer based on ITO, IZO, $Sn_xZn_yO$, or $ZnO_x$.

It is even more preferable to choose a barrier layer that can be etched, preferably one etched with the same etching solution as for the contact layer.

The barrier layer may be deposited by a vacuum deposition technique, especially by evaporation or preferably by magnetron sputtering, especially at ambient temperature.

In a preferred embodiment of the invention, the contact layer and the barrier layer are of identical nature, in particular made of pure, doped or even alloyed zinc oxide, and preferably the overlayer comprises ITO as outermost layer.

It is preferable to adapt the oxidation state and/or the fabrication conditions of the layer that surmounts the thin blocking layer (either the barrier layer or the overlayer) according to the nature of the thin blocking layer.

Thus, when the thin blocking layer is a metallic layer, it is possible to choose a superstoichiometric superjacent layer and/or to use a highly reactive plasma so as to oxidize the metallic layer in order to reduce its absorption.

Conversely, when the thin blocking layer is based on a substoichiometric metal nitride and/or metal oxide, a pure metal oxide layer or a layer of doped metal oxide $M(N)O_{x'}$ is deposited, where x' is less than 1 in order to limit the over-oxidation of the thin blocking layer and where x' is slightly less than 1 in order to avoid excessively high absorption of this thicker superjacent layer. In particular, a layer based on zinc oxide $ZnO_{x'}$, where x' is less than 1, preferably between 0.88 and 0.98, especially 0.90 to 0.95, is preferred.

Advantageously, the electrode according to the invention may have one or more of the following features:

a sheet resistance equal to or less than 10Ω/□ for a functional layer thickness of 6 nm upward, preferably 5Ω/□ or less for a functional layer thickness of 10 nm upward, preferably combined with a light transmission $T_L$ equal to or greater than 70%, and even more preferably greater than 80%, thereby making its use as a transparent electrode particularly satisfactory;

a sheet resistance equal to or less than 10Ω/□ for a functional layer thickness of 50 nm upward, preferably equal to or less than 0.6Ω/□, preferably combined with a light reflection $R_L$ equal to or greater than 70%, and even more preferably greater than 80%, thereby making its use as a reflective electrode particularly satisfactory;

a sheet resistance equal to or less than 3Ω/□ for a functional layer thickness of 20 nm upward, preferably equal to or less than 1.8Ω/□, preferably combined with a $T_L/R_L$ ratio of between 0.1 and 0.7, thereby making its use as a semitransparent electrode particularly satisfactory; and the surface of the overlayer may have an RMS roughness (also called Rq) equal to or less than 3 nm, preferably equal to or less than 2 nm, and even more preferably equal to or less than 1.5 nm, so as to avoid spike defects which would drastically reduce the lifetime and the reliability in particular of the OLED.

The RMS roughness denotes the root mean square roughness. This is a measure of the RMS deviation of the roughness. This RMS roughness therefore specifically quantifies on average the height of the peaks and troughs of the roughness relative to the average height. Thus, an RMS roughness of 2 nm means a double peak amplitude.

It may be measured in various ways: for example, by atomic force microscopy, by a mechanical stylus system (using for example the measurement instruments sold by VEECO under the name DEKTAK) and by optical interferometry. The measurement is generally performed over an area of one square micron by atomic force microscopy and over a larger area, of around 50 microns to 2 millimeters, by mechanical stylus systems.

The functional layer is based on a pure material chosen from silver Ag, Au, Cu or Al or based on said material alloyed or doped with Ag, Au, Al, Pt, Cu, Zn, In, Si, Zr, Mo, Ni, Cr, Mg, Mn, Co, Sn and Pd. For example, mention may be made of Pd-doped silver or a gold/copper alloy or a silver/gold alloy.

The functional layer may be deposited by a vacuum deposition technique, especially by evaporation or preferably by magnetron sputtering, especially at ambient temperature.

If a high conductivity is particularly desired, it may be preferable to choose a pure material. If remarkable mechanical properties are particularly desired, it may be preferable to choose a doped or alloyed material.

Preferably, a layer based on silver is chosen for its conductivity and its transparency.

The thickness of the chosen silver-based functional layer may be between 3 and 20 nm, preferably between 5 and 15 nm. In this thickness range, the electrode remains transparent.

However, it is not excluded to have a considerably thicker layer, especially in the case in which the organic light-emitting system operates in reflection. The thickness of the chosen silver-based functional layer may be between 50 and 150 nm, preferably between 80 and 100 nm.

The thickness of the chosen silver-based functional layer may furthermore be between 20 and 50 nm in order to switch from an operation mainly in transmission to an operation mainly in reflection.

The contact layer may preferably be based on at least one of the following stoichiometric or nonstoichiometric metal oxides: chromium oxide, indium oxide, zinc oxide, aluminum oxide, titanium oxide, molybdenum oxide, zirconium oxide, antimony oxide, tantalum oxide, silicon oxide or even tin oxide.

Typically, the metal oxide may be doped between 0.5 and 5%. In particular, it may be Al-doped zinc oxide (AZO), Ga-doped zinc oxide (GZO), or even B-doped, Sc-doped or Sb-doped zinc oxide for better stability of the deposition process, or even F-doped or S-doped tin oxide.

The contact layer may be based on a mixed oxide, especially generally a nonstoichiometric mixed tin zinc oxide $Sn_xZn_yO_z$ as an amorphous phase, or a mixed indium tin oxide (ITO) or a mixed indium zinc oxide (IZO).

The contact layer may be a monolayer or a multilayer. This layer preferably has a thickness (in total) of between 3 and 30 nm, more preferably between 5 and 20 nm.

Preferably, a layer which is not toxic, a layer which is easy and/or rapid to produce, and is optionally transparent if necessary, especially a doped or undoped layer based on ITO, IZO, $Sn_xZn_yO_z$ or $ZnO_x$, is chosen.

It is even more preferable to choose a layer of crystalline nature in a preferential growth direction in order to promote heteroepitaxy of the metallic functional layer. This layer may most particularly be etchable by RIE (reactive ion etching) or even more preferably by wet etching (which can be easily integrated into the fabrication phase and carried out at atmospheric pressure). Preferably, the same etchant as for the overlayer (acid solution, reactive plasma(s) of the Ar, $CF_4$, $SF_6$ and $O_2$ type, etc.) is used.

Thus, a layer of zinc oxide $ZnO_x$, where preferably x is less than 1 and even more preferably between 0.88 and 0.98, especially 0.90 to 0.95, is preferred. This layer may be pure or doped with Al or with Ga, as already indicated.

The Applicant has found that wet etching the electrode in one step was possible even when the functional layer is relatively thick, for example with a thickness between 30 and 70 nm (depending on the concentration and the etching solution chosen), in particular if the latter is relatively porous. By modifying the deposition parameters, it may be possible to obtain a certain porosity of this functional layer. It is thus possible to choose a relatively high pressure. Other parameters, such as the temperature of the process and the mixture of the gases used during the process, may also be varied.

Within the context of the invention, a material is etchable by an etching solution if said material dissolves in the solution or is sufficiently corroded by the solution and, at the very least, the attachment of said material is sufficiently weakened so that a slight mechanical action, especially rinsing with a low-pressure jet, is sufficient to remove the material.

The contact layer may be deposited by various techniques. For example, it may be deposited by a pyrolysis technique, especially in the gas phase (which technique is often denoted by the abbreviation CVD, standing for chemical vapor deposition).

The electroconductive layer may be deposited by a vacuum deposition technique, especially by evaporation or preferably magnetron sputtering, in particular at ambient temperature. The sputtering may be reactive sputtering (using metal or suboxidized targets in an oxidizing atmosphere) or nonreactive sputtering (using ceramic targets in an inert atmosphere).

In particular when the contact layer is based on a metal oxide, it is possible to insert a thin blocking layer, called the lower blocking layer, between the contact layer and the functional layer, which is based on a metal having a thickness of 5 nm or less, preferably between 0.5 and 2 nm, and/or a metal oxide, oxynitride or nitride, with a thickness of 10 nm or less, preferably between 0.5 and 2 nm, for example based on the aforementioned materials for the blocking layer.

This thin lower blocking layer (whether a monolayer or a multilayer) serves as a bonding, nucleating and/or protective layer during an optional heat treatment carried out after the deposition.

The electrode according to the invention may furthermore be associated with a base layer capable of forming an alkali metal barrier, especially when the contact layer is based on an oxide.

The base layer gives the electrode according to the invention many advantages. Firstly, it is capable of being a barrier to alkali metals below the electrode. It protects the contact layer from any contamination (which contaminations may result in mechanical defects, such as delaminations). It also maintains the electrical conductivity of the metallic functional layer. It also prevents the organic structure of an OLED device from being contaminated by alkali metals, which would in fact considerably reduce the lifetime of the OLED.

The migration of alkali metals may occur during the fabrication of the device, causing a lack of reliability, and/or subsequently, reducing its lifetime.

The base layer improves the bonding properties of the contact layer without appreciably increasing the roughness of the assembly.

The invention is of course most particularly advantageous in the case of a carrier substrate liable to discharge alkali metals, such as, in particular, clear or extra-clear soda-lime-silica glass.

Moreover, thanks to this particular multilayer coating structure, a reliable electrode is furthermore obtained, enabling significant productivity gains to be achieved.

The base layer is robust and easy and rapid to deposit using various techniques. It may be deposited, for example, by a pyrolysis technique, especially in the gas phase (this technique is often denoted by CVD, standing for chemical vapor deposition). This technique is beneficial in the case of the invention since appropriate adjustments of the deposition parameters enable a very dense layer to be obtained for an enhanced barrier.

The base layer may be deposited by a vacuum deposition technique, especially by evaporation or magnetron sputtering, in particular at ambient temperature.

The base layer may optionally be doped with aluminum in order to make its vacuum deposition more stable.

The base layer (whether a monolayer or a multilayer, and optionally doped) may have a thickness of between 10 and 150 nm and even more preferably between 20 and 100 nm.

The base layer may preferably be:

based on silicon oxide or silicon oxycarbide, this layer having a general formula SiOC; or based on silicon nitride, silicon oxynitride or silicon oxycarbonitride, this layer having a general formula SiNOC, especially SiN, in particular $Si_3N_4$.

The electrode may preferably include a wet-etch stop layer between the base layer and the contact layer, especially a layer based on tin oxide, especially a layer with a thickness of between 10 and 100 nm, even more preferably between 20 and 60 nm. Most particularly, for the sake of simplicity, the wet-etch stop layer may be part of or be the base layer—preferably, it may be based on silicon nitride or may be a layer that is based on silicon oxide or based on silicon oxycarbide and with tin for enhancing by anti-wet-etching property, layer of general formula SnSiOCN.

The wet-etch stop layer serves to protect the substrate in the case of chemical etching or reactive plasma etching.

Thanks to the (dry or wet) etch stop, the base layer remains present even in the etched or patterned zone(s). Thus, the migration of alkali metals, by an edge effect, between the substrate in an etched zone and an adjacent electrode part (or even an organic structure) may be stopped.

A base/etch-stop layer (essentially) made of doped or undoped silicon nitride $Si_3N_4$ may most particularly be preferred. Silicon nitride is very rapidly deposited and forms an excellent barrier to alkali metals. Furthermore, thanks to its high optical index relative to the carrier substrate, it allows the optical properties of the electrode to be adapted, by preferably varying the thickness of this base layer. Thus, it is possible to adjust for example the color in transmission when the electrode is transparent, or in reflection when the opposite face of the carrier substrate is a mirror.

Advantageously, the base layer and preferably the optional wet-etch stop layer may cover approximately all (or almost all) of a main face of a flat glass substrate.

And even more preferably, the contact layer, the optional lower blocking layer, the functional layer, the thin blocking layer and the film are structured in one and the same etching pattern and preferably by a single wet etching operation. This will be explained in detail later in the present application.

The etch stop layer, if it is present, is preferably intact, but it may be slightly etched, for example over a tenth of its initial thickness. Preferably, the same applies to the base layer if the etch stop layer is not present.

The electrode may be wider than the organic structure or another element on top, in order to make electrical contacting easier.

Furthermore, a border of the overlayer may be surmounted by a current supply strip (this may be continuous or discontinuous, forming part of a collector or of a current distributor) preferably with a thickness of between 0.5 and 10 µm and in the form of a metallic monolayer made of one of the following metals: Mo, Al, Cr, Nd or an alloy of metals such as MoCr, AlNd or a metallic multilayer such as MoCr/Al/MoCr.

This strip may be designed during the etching phase.

The electrical supply means may also be added after the etching operation, for example may be made of a conductive enamel, for example based on silver, and screen-printed.

In preferred embodiments of the invention, one or more of the following arrangements may optionally furthermore be employed:

the total thickness of ITO or even of indium in the electrode may be equal to or less than 30 nm, or even less than 20 nm; and the total thickness (with the base layer) is between 30 nm and 250 nm.

The invention applies not only to multilayer coatings having only a single "functional" layer, but also to multilayer coatings comprising a plurality of functional layers, especially two functional layers alternating with two or three films.

In the case of a multilayer coating having multiple functional layers, at least one, and preferably each, functional layer is provided with a blocking layer called an "overblocker" layer according to the invention (or with a blocking layer called an "underblocker" layer).

Thus, the electrode comprises, placed n times on the optional base layer and/or wet-etch stop layer, where n is an integer equal to or greater than 1, the following structure: the contact layer, optionally the thin lower blocking layer, the functional layer, the thin blocking layer and optionally the water and/or oxygen barrier layer, the structure being surmounted by a sequence comprising the contact layer, the functional layer, the thin blocking layer, optionally the water and/or oxygen barrier layer and said overlayer.

The flat substrate may be transparent (in particular for emission through the substrate). The flat substrate may be rigid, flexible or semiflexible.

Its main faces may be rectangular, square or even of any other shape (round, oval, polygonal, etc.). This substrate may be of large size, for example with an area greater than $0.02 \text{ m}^2$, or even $0.5 \text{ m}^2$ or $1 \text{ m}^2$, and with a lower electrode occupying substantially the entire area (apart from the structuring zones).

The flat substrate is preferably made of glass, especially a soda-lime-silica glass. Advantageously, the substrate may be a glass having an absorption coefficient of less than $2.5 \text{ m}^{-1}$, preferably less than $0.7 \text{ m}^{-1}$, at the wavelength of the OLED radiation.

For example, soda-lime-silica glasses with less than 0.05% Fe (III) or $Fe_2O_3$ are chosen, especially the glass DIAMANT from Saint-Gobain Glass, the glass OPTIWHITE from Pilkington, or the glass B270 from Schott. All the extra-clear glass compositions described in document WO04/025334 may be chosen.

In a chosen configuration for emission of the OLED system through the thickness of the transparent substrate, part of the emitted radiation is guided in the substrate.

In addition, in an advantageous design of the invention, the thickness of the chosen glass substrate may be at least 1 mm, preferably at least 5 mm, for example. This allows the number of internal reflections to be reduced, and thus enables more of the radiation guided in the glass to be extracted, thereby increasing the brightness of the luminous zone.

The edges of the panel may also be reflective and preferably have a mirror, for optimum recycling of the guided radiation, and the edges make with the main face associated with the OLED system an external angle equal to or greater than 45°, preferably equal to or greater than 80°, but less than 90°, in order to redirect the radiation over a wider extraction area. The panel may thus be bevelled.

In document JP 2005-038642, in order for the electrodes to be electrically separated the bottom electrode is structured in several etching steps involving various acids and at various etching rates. Thus, the work-function-matching layer is firstly etched, then the metallic layer and finally the contact layer.

One object of the invention is to be able to obtain an assembly of electroconductive layers in order to form a reliable electrode which is robust (especially in terms of thermal and mechanical stability and/or resistance) without sacrificing its electroconductivity properties and its optical quality, nor the performance of the device incorporating it, nor causing production difficulties, especially during wet etching.

Thus, the invention provides a process for the acid etching of a multilayer electrode on a substrate, especially a glass substrate, which includes an acid-etch stop layer, preferably one based on silicon nitride, the electrode comprising:

a contact layer made of a doped or undoped metal oxide chosen from zinc oxide, mixed tin zinc oxide, mixed indium tin oxide or mixed indium zinc oxide ($ZnO_x$, $Sn_xZn_yO_z$, ITO or IZO);

optionally, a thin lower blocking layer directly beneath a functional layer, the layer comprising a metallic layer with a thickness of 5 nm or less and/or a layer with a thickness of 10 nm or less, which is based on a substoichiometric metal oxide or metal oxynitride or metal nitride;

the doped or undoped metallic functional layer having intrinsic electrical conductivity properties, with a thickness of 70 nm or less, chosen from silver and/or gold;

a thin blocking layer directly on the functional layer, the layer comprising a metallic layer with a thickness of 5 nm or less, and/or a layer with a thickness of 10 nm or less, which is based on a substoichiometric metal oxide or metal oxynitride or metal nitride;

optionally, a doped or undoped metal oxide barrier layer chosen from zinc oxide, mixed tin zinc oxide, mixed indium tin oxide or mixed indium zinc oxide; and an overlayer made of an optionally mixed conductive oxide chosen from indium oxide, zinc oxide and tin oxide and/or an overlayer with a thickness of 10 nm or less made of a substoichiometric oxide chosen from molybdenum oxide, nickel oxide, aluminum oxide, titanium oxide, zirconium oxide, tantalum oxide, silicon oxide or silver, gold, platinum or palladium oxide, the etching being carried out in one step using an acid solution chosen from pure nitric acid $HNO_3$ or nitric acid mixed with hydrochloric acid HCl, or pure hydrochloric acid or hydrochloric acid mixed with iron trichloride $FeCl_3$, otherwise known as Fe (III) chloride.

Of course, the etch stop layer may be the base layer already presented above.

Thus, etching patterns may be etched in which the width and the spacing vary depending on the applications.

The etching may be carried out in the presence of at least one metal current supply strip preferably in the form of a monolayer based on one of the following metals: Mo, Al, Cr, Nd or an alloy such as MoCr, AlNd, or in the form of a multilayer such as MoCr/Al/MoCr.

The invention also relates to an organic light-emitting device comprising at least one carrier substrate, especially a glass substrate, provided with at least one organic light-emitting layer placed between the bottom electrode as described above and what is called a top electrode.

The OLED device may produce monochromatic, especially blue and/or green and/or red, light or may be adapted so as to produce white light.

To produce white light, several methods are possible: mixing of compounds (red, green, blue emission) in a single layer; stacking on the face of the electrodes of three organic structures (red, green, blue emission) or two organic structures (yellow and blue); series of three adjacent organic structures (red, green, blue emission); on the face of the electrodes, one organic structure in one color and on the other face suitable phosphor layers.

The OLED device may comprise a plurality of adjacent organic light-emitting systems, each emitting white light or, by a series of three systems, red light, green light and blue light, the systems being for example connected in series.

The device may form part of a multiple glazing unit, especially a vacuum glazing unit or one with an air layer or layer of another gas. The device may also be monolithic and comprise a monolithic glazing unit in order to be more compact and/or lighter.

The OLED system may be bonded to, or preferably laminated with another flat substrate, called a cover, preferably transparent, such as a glass, using a laminating interlayer, especially an extra-clear interlayer.

The laminated glazing units usually consist of two rigid substrates between which a thermoplastic polymer sheet or superposition of such sheets is placed. The invention also includes what are called "asymmetric" laminated glazing units using in particular a rigid carrier substrate of the glass type and, as a covering substrate, one or more protective polymer sheets.

The invention also includes laminated glazing units having at least one interlayer sheet based on a single-sided or double-sided adhesive polymer of the elastomer type (i.e. one not requiring a lamination operation in the conventional meaning of the term, i.e. lamination requiring heating generally under pressure so as to soften the thermoplastic interlayer sheet and make it adhere).

In this configuration, the means for fastening the cover to the carrier substrate may then be a lamination interlayer, especially a sheet of thermoplastic, for example polyurethane (PU), polyvinyl butyral (PVB) or ethylene/vinyl acetate (EVA), or a thermally curable single-component or multi-component resin (epoxy, PU) or ultraviolet-curable single-component or multi-component resin (epoxy, acrylic resin). Preferably, the sheet has (substantially) the same dimensions as the cover and the substrate.

The lamination interlayer may prevent the cover from flexing, especially for large devices, for example with an area greater than 0.5 $m^2$.

In particular, EVA offers many advantages:

it contains little or no water by volume;

it does not necessarily require high pressure for processing it.

A thermoplastic lamination interlayer may be preferred to a cover made of cast resin as it is both easier to implement and more economical and is possibly more impervious.

The interlayer optionally includes an array of electroconductive wires set into what is called its internal surface, facing the top electrode, and/or an electroconductive layer or electroconductive strips on the internal surface of the cover.

The OLED system may preferably be placed inside the double glazing unit, with a layer of gas, especially an inert gas (for example argon).

The top electrode may be an electroconductive layer advantageously chosen from metal oxides, especially the following materials:

doped zinc oxide, especially aluminum-doped zinc oxide ZnO:Al or gallium-doped zinc oxide ZnO:Ga;

or else doped indium oxide, especially tin-doped indium oxide (ITO) or zinc-doped indium oxide (IZO).

More generally, it is possible to use any type of transparent electroconductive layer, for example a TCO (transparent conductive oxide) layer, for example with a thickness between 20 and 1000 nm.

It is also possible to use a thin metallic layer called a TCC (transparent conductive coating) for example made of Ag, Al, Pd, Cu, Pd, Pt In, Mo, Au and typically having a thickness of between 5 and 150 nm depending on the desired light transmission/reflection.

The electrode is not necessarily continuous. The top electrode may comprise a plurality of conducting strips or conducting wires (mesh).

Furthermore, it may be advantageous to add a film having a given functionality on the opposite face from the substrate bearing the electrode according to the invention or on an additional substrate. This may be an anti-fogging layer (using a hydrophilic layer), an anti-fouling layer (a photocatalytic coating comprising $TiO_2$, at least partly crystallized in anatase form), or else an anti-reflection multilayer coating for example of the $Si_3N_4/SiO_2/Si_3N_4/SiO_2$ type, or else a UV filter such as, for example, a layer of titanium oxide ($TiO_2$). It may also be one or more phosphor layers, a mirror layer or at least one scattering light extraction zone.

The invention also relates to the various applications to which these OLED devices may be put, said devices forming one or more luminous surfaces, which are transparent and/or reflecting (mirror function), placed both for outdoor and indoor applications.

The device may form, alternatively or in combination, an illuminating, decorative, architectural etc. system, or an indicating display panel—for example of the drawing, logo or alphanumeric indication type, especially an emergency exit panel.

The OLED device may be arranged to produce uniform light, especially for homogeneous illumination, or to produce various luminous zones, of the same intensity or of different intensity.

Conversely, differentiated illumination may be sought. The organic light-emitting system (OLED) produces a direct light zone, and another luminous zone is obtained by extraction of the OLED radiation that is guided by total reflection in the thickness of the substrate, which is chosen to be made of glass.

To form this other luminous zone, the extraction zone may be adjacent to the OLED system or on the other side from the substrate. The extraction zone or zones may serve for example to increase the illumination provided by the direct light zone, especially for architectural illumination, or else to indicate the luminous panel. The extraction zone or zones are preferably in the form of one or more, especially uniform, bands of light and these preferably being placed on the periphery of one of the faces. These bands may for example form a highly luminous frame.

Extraction is achieved by at least one of the following means placed in the extraction zone: a diffusing layer, preferably based on mineral particles and preferably with a mineral binder, the substrate made to be diffusing, especially a textured or rough substrate.

The two main faces may each have a direct light zone.

When the electrodes and the organic structure of the OLED system are chosen to be transparent, an illuminating window may in particular be produced. Improvement in illumination of the room is then not to the detriment of light transmission. By also limiting the light reflection, especially on the external side of the illuminating window, it is also possible to control the level of reflection, for example so as to meet the anti-dazzle standards in force for the walls of buildings.

More broadly, the device, especially a partly or entirely transparent device, may be:
intended for buildings, such as exterior luminous glazing, an internal luminous partition or a luminous glazed door (or part of a door), especially a sliding one;
intended for a transport vehicle, such as a luminous roof, a luminous side window (or part of a window), an internal luminous partition of a terrestrial, water-borne or airborne vehicle (automobile, truck, train, airplane, boat, etc.);
intended for urban or professional furniture, such as a bus shelter panel, a wall of a display counter, a jewellery display or a shop window, a greenhouse wall, or an illuminating tile;
intended for interior furnishings, a shelf or cabinet element, a façade of a cabinet, an illuminating tile, a ceiling, an illuminating refrigerator shelf, an aquarium wall;
intended for the backlighting of electronic equipment, especially a display screen, optionally a double screen, such as a television screen or a computer screen, a touch-sensitive screen.

For example, it is possible to envisage backlighting for a double-sided screen with different sizes, the small screen preferably being associated with a Fresnel lens to concentrate the light.

To form an illuminating mirror, one of the electrodes may be reflecting, or a mirror may be placed on the opposite face to the OLED system, if preferential lighting on only one side in the direct light zone is desired.

It may also be a mirror. The luminous panel may serve for lighting a bathroom wall or a kitchen worktop, or may be a ceiling.

The OLEDs are generally divided into two broad families depending on the organic material used.

If the light-emitting layers are formed from small molecules, the devices are referred to as SM-OLEDs (Small-Molecule Organic Light-Emitting Diodes). The organic light-emitting material of the thin layer consists of evaporated molecules, such as for example the complex $AlQ_3$ (tris(8-hydroxyquinoline)aluminum), DPVBi (4,4'-(diphenylvinylene)biphenyl), DMQA (dimethyl quinacridone) or DCM (4-(dicyanomethylene)-2-methyl-6-(4-dimethylaminostyryl)-4H-pyran). The emissive layer may also for example be a layer of 4,4',4''-tri(N-carbazolyl)triphenylamine (TCTA) doped with fac-tris(2-phenylpyridine)iridium ($Ir(ppy)_3$).

In general, the structure of an SM-OLED consists of a stack of HILs (hole injection layers), an HTL (hole transporting layer), an emissive layer and an ETL (electron transporting layer).

An example of a hole injection layer is copper phthalocyanine (CuPC) and the hole transporting layer may for example be N,N'-bis(naphthalen-1-yl)-N,N'-bis(phenyl)benzidine (alpha-NPB).

The electron transporting layer may be composed of tris (8-hydroxyquinoline)aluminum ($AlQ_3$) or bathophenanthroline (BPhen).

The top electrode may be an Mg/Al or LiF/Al layer.

Examples of organic light-emitting stacks are for example described in document U.S. Pat. No. 6,645,645.

If the organic light-emitting layers are polymers, the devices are referred to as PLEDs (polymer light-emitting diodes).

The organic light-emitting material of the thin layer consists of CES polymers (PLEDs) such as for example PPV standing for poly(para-phenylenevinylene), PPP (poly(para-phenylene)), DO-PPP (poly(2-decyloxy-1,4-phenylene)), MEH-PPV (poly[2-(2'-ethylhexyloxy)-5-methoxy-1,4-phenylenevinylene]), CN-PPV (poly[2,5-bis(hexyloxy)-1,4-phenylene-(1-cyanovinylene)]) or PDAFs (polydialkylfluorenes), and the polymer layer is also associated with a layer that promotes hole injection (an HIL) consisting for example of PEDT/PSS (poly(3,4-ethylene dioxythiophene)/poly(4-styrene sulfonate)).

One example of a PLED consists of the following stack:
a layer of poly(2,4-ethylene dioxythiophene) doped with poly(styrene sulfonate) (PEDOT:PSS) with a thickness of 50 nm; and
a layer of phenyl poly(p-phenylenevinylene) Ph-PPV with a thickness of 50 nm.

The top electrode may be a layer of Ca.

The invention will now be described in greater detail by means of nonlimiting examples and figures.

It should be pointed out that for the sake of clarity the various elements of the objects (including the angles) shown have not necessarily been drawn to scale.

Figure 1:
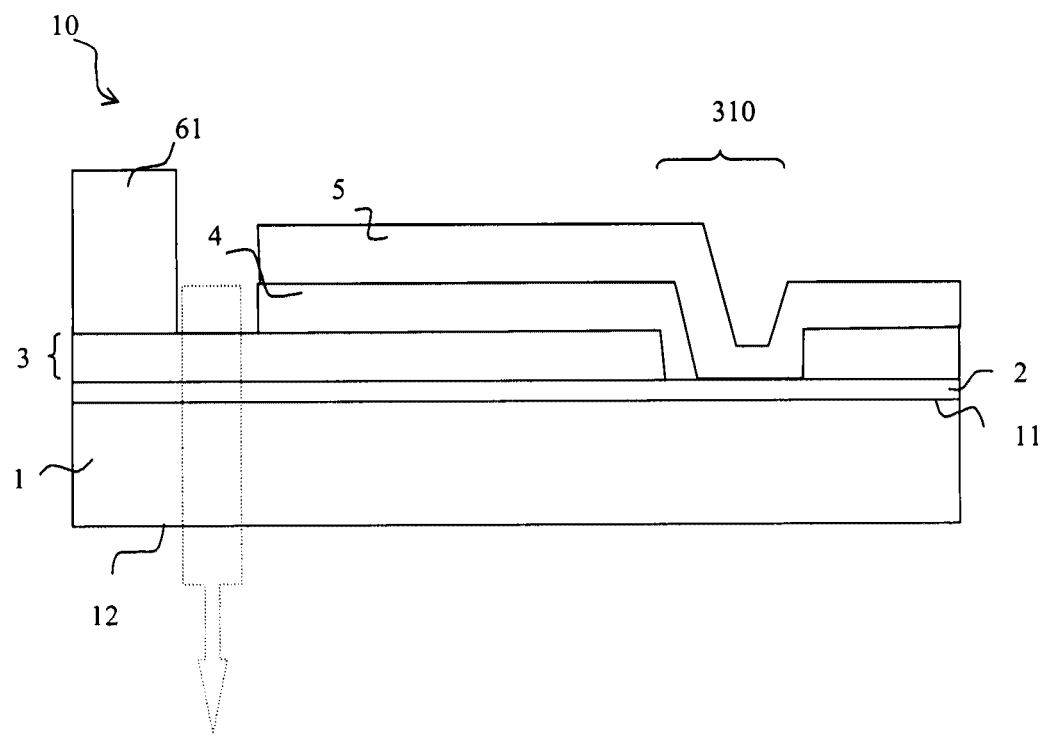
FIG. 1 is a schematic sectional view of an organic light-emitting device for uniform (back)lighting, which includes a bottom electrode according to the invention in a first embodiment.
Figure 2:
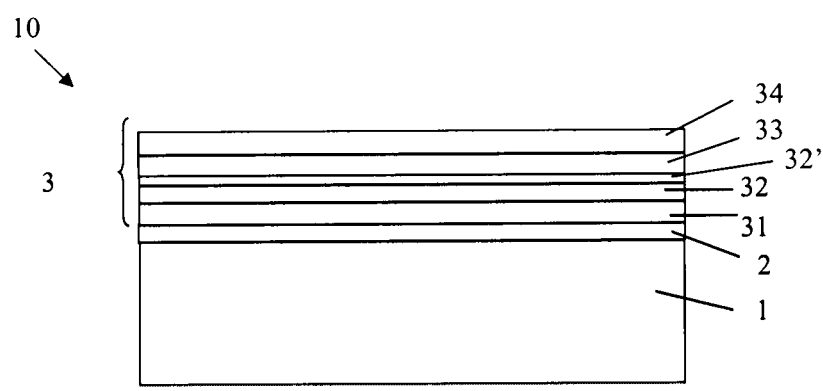
FIG. 2 is a partial view showing this bottom electrode in greater detail.

FIG. 1 is intentionally highly schematic. It shows in cross section an organic light-emitting device 10 (a bottom-emitting device, i.e. emitting through the substrate), comprising a flat substrate of clear or extra-clear soda-lime-silica glass 1, 2.1 mm in thickness, with first and second main faces 11, 12. The first main face 11 comprises:

a base layer 2, deposited directly on the first main face 11, also acting as wet-etch stop layer, made of silicon nitride with a thickness of between 10 nm and 80 nm and covering substantially all of the first main face 11;

an etched bottom electrode 3, deposited directly on the base layer 2, chosen to be transparent, comprising a multi-layer coating (see FIG. 2) of the type comprising:

a contact layer 31 chosen from $ZnO_x$, which is doped or undoped, $Sn_xZn_yO_z$, ITO or IZO;

a functional layer 32 made of silver, preferably pure silver, directly on the contact layer 31;

a thin blocking layer 32' directly on the functional layer 32, a metallic layer obtained preferably by a metal target with a neutral plasma, or a layer made of a nitride and/or an oxide of one or more metals, such as Ti, Ni, Cr, preferably obtained by a ceramic target with a neutral plasma;

a film formed from:

a protective layer 33 chosen from ZnOx, $Sn_xZn_yO_z$, ITO or IZO, the contact layer and the water and/or oxygen barrier layer being of identical nature and a work-function-matching overlayer 34, preferably the multilayer coating ZnO:Al/Ag/Ti, $TiO_x$ or NiCr/ZnO:Al/ITO having the following respective thicknesses: ZnO:Al 5 to 20 nm; silver 5 to 15 nm; $TiO_x$, Ti or NiCr 0.5 to 2 nm; ZnO:Al 5 to 20 nm; and ITO 5 to 20 nm;

an organic light-emitting system 4, for example an SM-OLED of the following structure:

an alpha-NPD layer;

a TCTA+Ir(ppy)$_3$ layer;

a BPhen layer;

an LiF layer; and a reflective, especially metallic, top electrode 5, in particular based on silver or aluminum.

The combination of layers 2 to 5 was deposited by magnetron sputtering at ambient temperature.

The bottom electrode 3 has the following characteristics:

a sheet resistance equal to or less than 5Ω/□;

a light transmission $T_L$ equal to or greater than 70% (measured on a full layer, before structuring) and a light reflection $R_L$ equal to or less than 20%, an RMS roughness (or Rq) equal to or less than 3 nm measured, by optical interferometry, over a square micron by atomic force microscopy.

For Si$_3$N$_4$ (25 nm)/ZnO:Al (10 nm)/Ag (12 nm)/Ti (1 nm)/ZnO:Al (20 nm)/ITO (20 nm), a $T_L$ of 83%, a stable sheet resistance and an RMS roughness of 1.3 nm are obtained. The Ti layer is deposited by sputtering in an inert atmosphere (i.e. without intentionally introducing oxygen or nitrogen) consisting of a noble gas (He, Ne, Xe, Ar or Kr).

The deposition conditions for each of the layers are preferably the following:

the Si$_3$N$_4$-based layer is deposited by reactive sputtering using an aluminum-doped silicon target at a pressure of 0.8 Pa in an argon/nitrogen atmosphere;

the silver-based layer is deposited using a silver target at a pressure of 0.8 Pa in a pure argon atmosphere;

the Ti layer is deposited using a titanium target, at a pressure of 0.8 Pa in a pure argon atmosphere;

the ZnO-based layers are deposited by reactive sputtering using an aluminum-doped zinc target, at a pressure of 0.3 Pa and in an argon/oxygen atmosphere; and the ITO-based layer are deposited using a ceramic target in an argon/oxygen atmosphere.

For a series of three specimens, each carrying said multilayer coating Si$_3$N$_4$ (25 nm)/ZnO:Al (10 nm)/Ag (12 nm)/Ti (1 nm)/ZnO:Al (20 nm)/ITO (20 nm), a sheet resistance of 4.35Ω/□, 4.37Ω/□ and 4.44Ω/□ is obtained respectively, i.e. a maximum deviation of 0.11 and an average sheet resistance of 4.39Ω/□.

For a series of three comparative specimens, each bearing this multilayer coating without the thin blocking layer, a sheet resistance of 4.4Ω/□, 4.75Ω/□ and 4.71Ω/□ is obtained respectively, i.e. a maximum deviation of 0.35—three times higher—and an average sheet resistance of 4.62Ω/□.

For this organic structure, the electrode of the invention enables the efficiency of the OLED in lm/W to be improved by at least 5 to 10% for a brightness greater than 500 cd/m$^2$ compared with an ITO electrode.

As a variant, the first electrode may include a thin lower blocking layer, especially a metallic layer preferably obtained using a metal target with an inert plasma or a layer made of a nitride and/or oxide of one or more metals such as Ti, Ni and Cr, preferably obtained using a ceramic target with an inert plasma.

Also as a variant, the first electrode may be a semitransparent electrode. For Si$_3$N$_4$ (20 nm)/ZnO:Al (20 nm)/Ag (30 nm)/TiO$_x$ (1 nm) or NiCr (1 nm)/ZnO:Al (40 nm)/ITO (20 nm), a $T_L$ of about 15%, an $R_L$ of about 80% and a sheet resistance of 0.9Ω/□ are obtained.

The first electrode may also be a reflective electrode.

The bottom electrode 3 extends along one side of the glass 1. The border of the overlayer 34 is thus surmounted by a first metal current supply strip 61, preferably with a thickness of between 0.5 and 10 μm, for example 5 μm, and in the form of a layer made of one of the following metals: Mo, Al, Cr, Nd or an alloy such as MoCr, AlNd or a multilayer such as MoCr/Al/MoCr.

The bottom electrode 3 may as a variant comprise the base layer and have a structure repeated n times, where n is an integer equal to or greater than 1, this structure being the following: the contact layer/the functional layer/the thin blocking layer/optionally the water and/or oxygen barrier layer.

This structure is surmounted by a sequence comprising the contact layer/the functional layer/optionally the water and/or oxygen barrier layer/said overlayer.

In the case of a stack of organic structures, for example emitting in the red, the green and the blue, in order to produce white light, it is also possible to repeat all the elements 3, 4, 5 three times or else simply to use a multilayer comprising: Al/ITO or Ag/optionally a thin similar blocking layer/ITO or Ag/optionally a thin similar blocking layer/ZnO/ITO for the additional bottom electrodes.

The top electrode extends along the opposite side from the glass 1. This border of the top electrode 5 is optionally surmounted by a second metal current supply strip, preferably similar to the first metal strip. This second strip is preferable if the top electrode has a thickness of 50 nm or less.

The second electrode may in fact also be, as a variant, a transparent or semitransparent electrode and for example may be identical to the first electrode. Optionally in this case, a reflector is added to the second face 12, for example a metallic layer 150 nm in thickness.

An EVA sheet can be used to laminate the glass 1 to another glass pane, preferably having the same characteristics as the glass 1. Optionally, the face 12 of the glass turned toward the EVA sheet is provided with a multilayer coating of given functionality described later.

The bottom electrode 3 is made in two parts separated by the structuring zone 310, for example a line.

Wet etching is used to electrically separate the bottom electrode 3 from the top electrode of the device 10.

To etch the entire bottom electrode (contact layer, functional layer, blocking layer, protective layer and overlayer) in one and the same etching pattern and in one operation, the layers—partly masked beforehand using an acid-resistant adhesive tape or as a variant using a photolithography mask— are exposed to one of the following acid solutions:

HCl (for example 40% concentration);

or HCl (for example 4% concentration);

or an HCl (for example 4% concentration)/$HNO_3$ (for example 7% concentration) mixture;

or an HCl/$FeCl_3$ mixture; or $HNO_3$ with a concentration between 10 and 18%.

Etching with hydrochloric acid results in very uniform etching profiles. The nitric acid/hydrochloric acid mixture also gives useful results. The HCl/$FeCl_3$ mixture is used conventionally in the case of ITO.

The etching profile, the etching time and the resolution may be adapted using mixtures of the two acids and by varying the concentrations.

Thus, it is possible to etch patterns with the width and spacing varying depending on the applications.

For small passive-matrix OLED screens (for the display of an electronic apparatus—mobile telephone, display, personal assistant, MP3 player, etc.), the width of each etched zone may be typically 10 to 20 µm, each etched zone being spaced apart by 10 to 50 µm, for example 35 µm (corresponding to the width of each electrode zone).

In the case of large passive-matrix OLED screens, for example for advertising or indicating displays, the width of each etched zone may be around 0.5 mm and the width of each electrode zone may be a few mm, a few cm or more, etc.

For uniform lighting, the width of each etched zone may be equal to or less than 100 µm, more preferably equal to or less than 50 µm, irrespective of the size of the screen.

Figure 3:
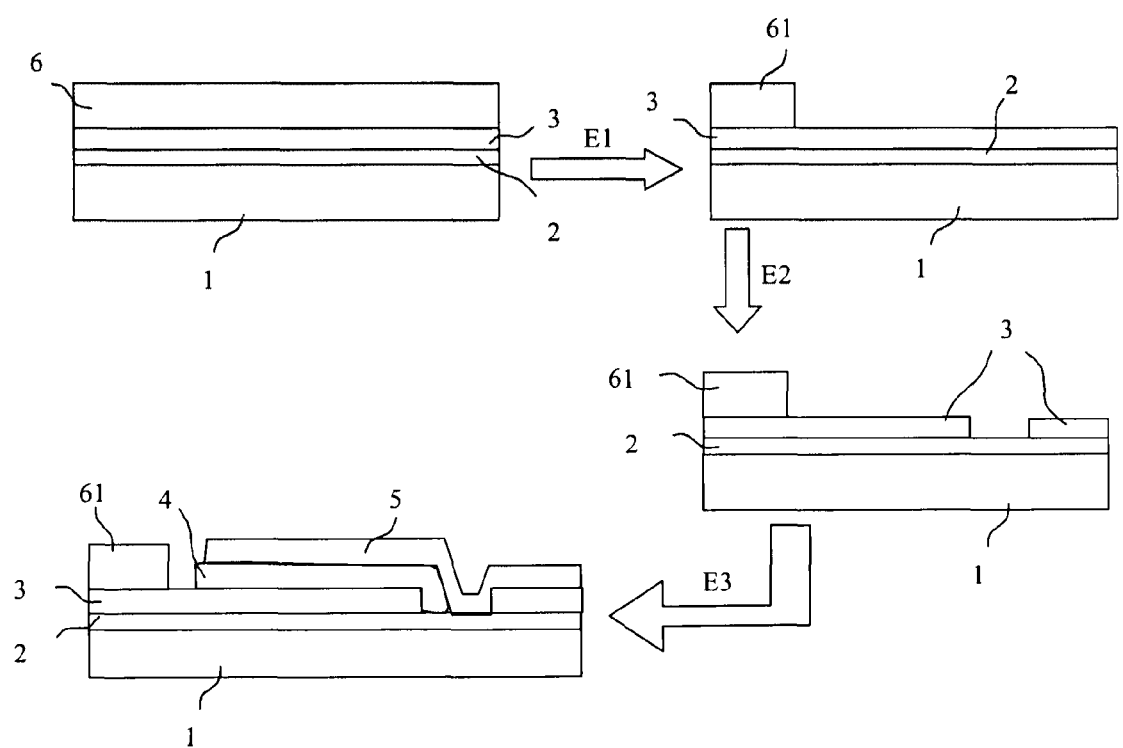
FIG. 3 illustrates a process for fabricating and etching this electrode.

FIG. 3 illustrates a process for fabricating and etching this electrode.

After the base layer 2, the electrode 3 and the metallic current supply layer 6 (whether a monolayer or a multilayer) have been deposited, this layer 6 is etched with a solution that does not etch the electrode, for example sodium hydroxide (step E1) and then the bottom electrode 3 is etched in a single step as already indicated (step E2), followed by the deposition of the OLED system 4 and the top electrode 5, for example made of Al, thereon (step E3).

Figure 4:
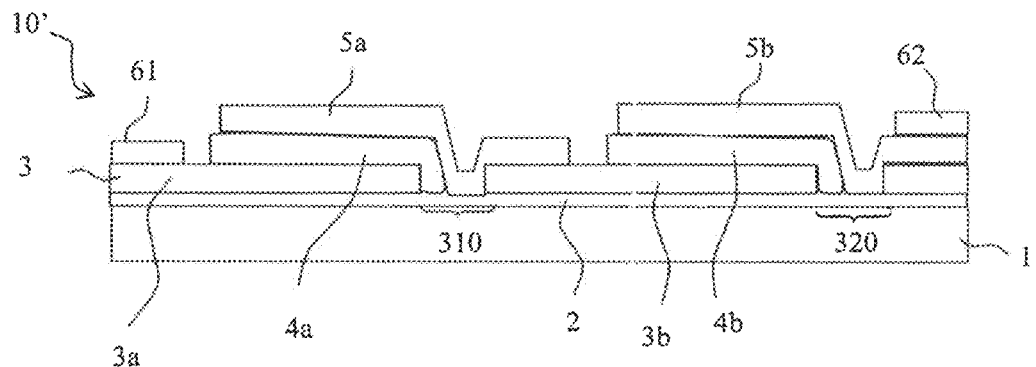
FIG. 4 illustrates a schematic sectional view of an organic light-emitting device for uniform (back)lighting, which is arranged in several zones and includes a bottom electrode according to the invention in a second embodiment.

FIG. 4 illustrates a schematic sectional view of an organic light-emitting device 10', for uniform (back)lighting, which is arranged in several zones and comprises a bottom electrode according to the invention in a second embodiment.

This second device 10' differs from the first device 10 by the elements described below.

The device 10' comprises two adjacent organic light-emitting systems 4a and 4b, each preferably emitting white light or, as a variant, in series of threes, red, green and blue light. The systems 4a and 4b are connected in series. The bottom electrode is mainly divided into two rectangles or squares 3a, 3b having sides of around ten cm, each extending on one side (on the left in the figure). These electrode zones are separated by the etching zone 310. The second electrode zone 3b is separated by the etching zone 320 from a "residual" bottom electrode zone (on the right in the figure). The first bottom electrode section 3a is partly covered with a first metal strip forming a busbar 61.

The top electrode is also divided. The first top electrode section 5a extends toward the right side and covers the left edge of the second bottom electrode section 3b. The second top electrode section 5b extends toward the right side and covers the left edge of the residual bottom electrode section and is covered by a second metal strip forming a busbar 62.

The etching zones 310, 320 are for example strips from 20 to 50 µm in width so as to be almost invisible to the naked eye.

Figure 5:
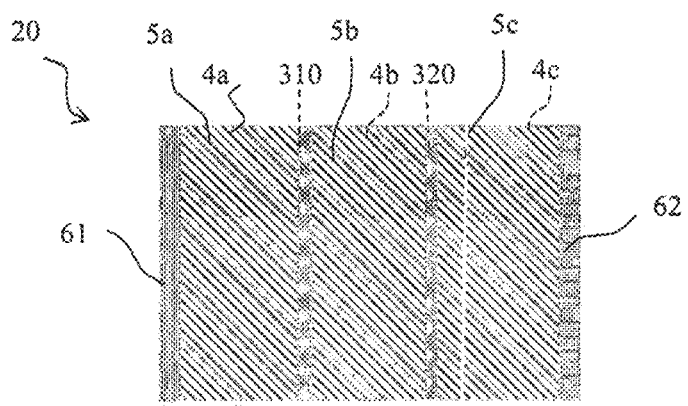
FIGS. 5 and 6 illustrate schematic top views showing two diagrams for electrically connecting electrodes similar to those used in the second embodiment.
Figure 6:
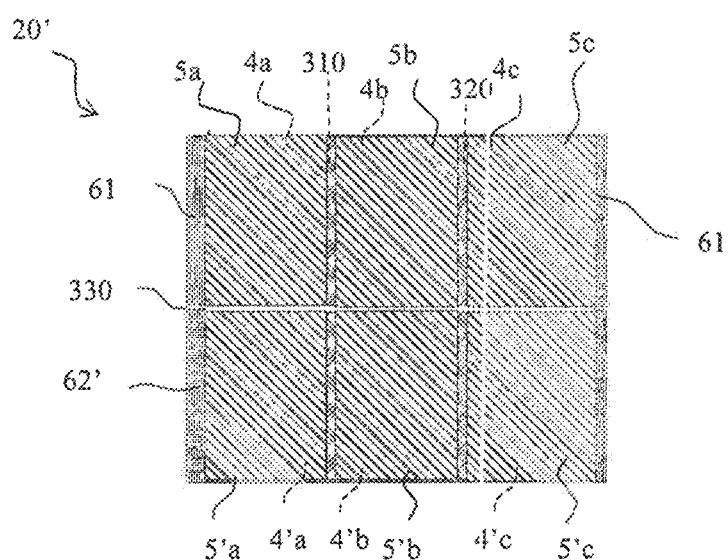

FIGS. 5 and 6 illustrate schematic top views showing two schemes for electrically connecting electrodes 20, 20' similar to those used in the second embodiment.

In FIG. 5, three organic light-emitting systems 4a to 4c are connected in series. The etching zones 310 and 320 are strips 20 to 50 µm in width, so as to be almost invisible to the naked eye.

The bottom electrode is divided into three rectangles each around ten cm in width, each extending on one side (the left in the figure). They are separated by etching zones 310, 320. The top electrode 5a to 5c is also divided into three. The first bottom electrode section is partly covered by a first metal strip forming a busbar 61.

The first two top electrode sections 5a, 5b extend toward the right side and cover the left edge of the adjacent bottom electrode section. The third top electrode section 5c extends toward the right side and covers the left edge of a residual bottom electrode section and is partly covered by a second metal strip forming a busbar 62.

In FIG. 6, six organic light-emitting systems 4a to 4c, 4'a to 4'c are connected in series (three upper ones and three lower ones). The etching zones 310 to 330 are both lateral 310, 320 and longitudinal 330, and are strips 20 to 50 µm in width so as to be almost invisible to the naked eye.

The bottom electrode is divided into six squares having sides of around ten cm, each extending on one side (the left in the figure). The bottom electrode sections are separated by the etching zones 310 to 330'. The first strip forming a busbar is cut so as to form a current collector with two strips 61', 62' on the left side of the figure.

The top electrode 5a to 5c, 5'a to 5'c is also divided into six. The first two upper top electrode sections 5a and 5b (in the top left of the figure) extend toward the right side and cover the left edge of the third section of the adjacent bottom electrode.

The third upper top electrode section 5c extends toward the right side and covers the left edge of the residual bottom electrode section and is covered by a metal strip forming 610 an electrical interconnection with the third lower electrode section (on the right in the figure).

The first two lower top electrode sections 5'a and 5'b (bottom left in the figure) extend toward the right side and cover the left edge of the third lower section of the adjacent bottom electrode.

Figure 7:
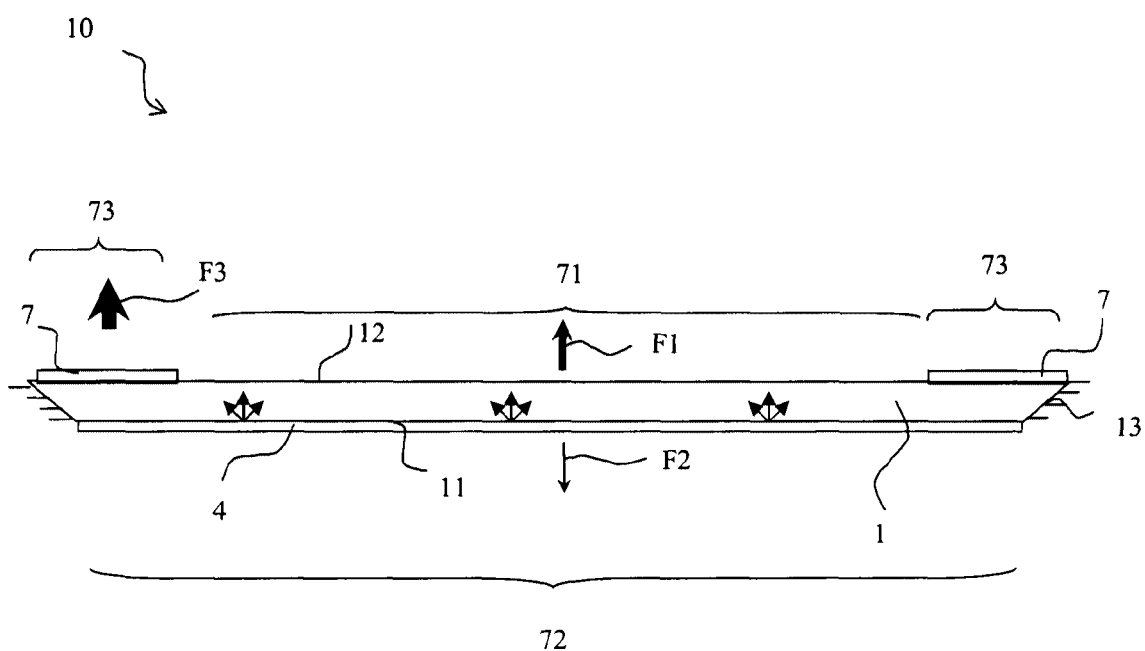
FIG. 7 shows a lateral sectional schematic view of an organic light-emitting device used for differentiated lighting.

FIG. 7 shows a schematic lateral sectional view of an organic light-emitting device 10 which is used for differentiated lighting.

This device 10 firstly comprises a flat transparent substrate, preferably a glass sheet 1, preferably made of thick glass with a thickness for example of 4 or 6 mm, with an absorption coefficient in the visible of 2.5 m$^{-1}$ or less. It is preferable to choose an extra-clear soda-lime glass having an absorption coefficient in the visible of less than 0.7 m$^{-1}$. This glass sheet 1 has first and second parallel main faces 12, 11 and an end face 13. The device is closed off in its lower part by a cover (not illustrated here).

The OLED-type light-emitting device 10 includes an OLED system 4 positioned on a bottom electrode of the ZnO:Al (20 nm)/Ag (12 nm)/Ti (1 nm)/ZnO:Al (20 nm)/ITO (20 nm) type which is on a 25 nm Si$_3$N$_4$ base layer placed on the first main face 11. First direct light zones 71, 72 on either side of the glass pane 1 are defined.

The first direct light zone 71, on the opposite side from the OLED system 4 relative to the substrate 1, covers the central portion of the first main face 12. The second direct light zone 72, on the same side as the OLED system 4, extends over the entire second main face 11.

The characteristics of the device 10 are adapted so that the luminance L1 of the first direct light zone 71 is preferably greater than the luminance L2 of the second direct light zone 72 (as shown symbolically by the thick arrow F1 and the thin arrow F2).

To have L1 greater than L2, the device 10 is therefore emitting mainly via the bottom electrode. For example, L1 is chosen to be equal to about 1000 cd/m$^2$ and L2 equal to about 500 cd/m$^2$ for visual comfort.

The device 10 is also a source of radiation guided in the thickness of the glass 1, by total internal reflection. The guided radiation is extracted from the edges of the first face 11 by means of a diffusing layer 7, for example based on mineral scattering particles dispersed in a mineral binder. Thus, a third light zone 73 forming a peripheral luminous frame is defined. As a variant, the diffusing layer 7 forms only lateral bands or peripheral longitudinal bands.

To promote extraction of the guided radiation, each of the edges forming the end face 13 makes an external angle of greater than 80° with the second main face 11 associated with the light source 10 and includes a mirror 14, for example a metallic silver or copper layer.

The device 10 may be intended for buildings, as an illuminating window, an illuminating door, a greenhouse wall or glass roof, or else a vehicle side window or an illuminating roof. The second face 12 is the inner face (the most illuminating face).

When the device 10 is lit, the direct light zone 71 31 can preserve the privacy of a person inside a room or passenger compartment at night or in a dark environment. To do this, all that is required is for the light flux delivered by the glazing unit to be at least equal to that reflected and returned via the room.

The device 10 may form a double glazing unit, the device 2 preferably being located in the internal gas-filled space between the glass 1 and an optionally thinner additional glass pane.

The device 10 thus designed may also serve as an illuminating transparent shelf, luminous refrigerator shelf, illuminating transparent partition between two rooms or an aquarium wall. The characteristics of the device 10 may therefore be adapted so that the luminance L1 of the first direct light zone 71 is approximately equal to the luminance L2 of the second direct light zone 72.

The light zones 71, 72 are uniform. As a variant, the device 10 may also have at least one direct light zone which is discontinuous and/or forms a design, logo or indication.

Additional Functions

As already stated, it may be judicious to functionalize the second face of the carrier substrate 1 (on the opposite side from the organic light-emitting system).

Thus, thin layers are deposited on the surface that are intended to give them a particular property, such as for example that consisting in allowing the substrate to remain as clean as possible, irrespective of environmental attack, i.e. for the purpose of maintaining over time the surface properties and appearance, and in particular enabling the cleaning operations to be spaced further apart, by succeeding in eliminating dirt progressively as this builds up on the surface of the substrate, especially dirt of organic origin, such as fingerprints or volatile organic substances in the atmosphere, or even dirt of the sweat or pollution dust type.

Now, it is known that there are certain semiconductor materials based on a metal oxide that are capable, under the effect of radiation of suitable wavelength, of initiating radical reactions causing oxidation of organic substances: these materials are generally referred to as "photocatalytic" or "photoreactive" materials.

In the field of substrates having a glazing function, it is known to use photocatalytic films on a substrate, which have a pronounced "antisoiling" effect and can be manufactured on an industrial scale. These photocatalytic films generally contain at least partially crystalline titanium oxide incorporated into said film in the form of particles, especially with a size of between a few (3 or 4) nanometers and 100 nm, preferably about 50 nm, essentially being crystallized in anatase or anatase/rutile form.

This is because titanium oxide is one of the semiconductors which, under the action of light in the visible or ultraviolet range, degrade organic substances that are deposited on their surfaces.

Thus, according to a first exemplary embodiment, the film having a photocatalytic property results from a solution based on TiO$_2$ nanoparticles and a mesoporous silica (SiO$_2$) binder.

According to a second exemplary embodiment, the film having a photocatalytic property results from a solution based on TiO$_2$ nanoparticles and a non-structured silica (SiO$_2$) binder.

Furthermore, irrespective of the embodiment of the photocatalytic film as regards the titanium oxide particles, these have been chosen to be based on at least partially crystalline titanium oxide because it has been shown that this is much more effective in terms of photocatalytic property than amorphous titanium oxide. Preferably, the oxide is crystallized in anatase form, rutile form or in the form of an anatase/rutile mixture.

The film is fabricated so that the crystalline titanium oxide that it contains is in the form of "crystallites", i.e. single crystals, having an average size of between 0.5 and 100 nm, preferably 3 to 60 nm. The reason for this range of dimensions is that titanium oxide appears to have an optimum photocatalytic effect, probably because the crystallites of this size develop a large active surface area.

The film having a photocatalytic property may also include, apart from titanium oxide, at least one other type of mineral material, especially in the form of an amorphous or partially crystalline oxide, for example a silicon oxide (or mixture of oxides), titanium oxide, tin oxide, zirconium oxide or aluminum oxide. This mineral material may also participate in the photocatalytic effect of the crystalline titanium oxide, by having itself a certain photocatalytic effect, albeit small compared with that of crystalline TiO$_2$, which is the case with amorphous or partially crystalline titanium oxide.

It is also possible to increase the number of charge carriers by doping the titanium oxide crystal lattice, by inserting at least one of the following metal elements thereinto: niobium, tantalum, iron, bismuth, cobalt, nickel, copper, ruthenium, cerium, molybdenum.

This doping may also be carried out by doping just the surface of the titanium oxide or of the entire film, the surface doping being carried out by covering at least part of the film with a layer of metal oxides or metal salts, the metal being chosen from iron, copper, ruthenium, cerium, molybdenum, vanadium and bismuth.

Finally, the photocatalytic effect may be enhanced by increasing the yield and/or rate of the photocatalytic reactions, by covering the titanium oxide, or at least part of the film that incorporates it, with a noble metal in the form of a thin platinum, rhodium or silver layer.

The film having a photocatalytic property also has an outer surface of pronounced hydrophilicity and/or oleophilicity, especially if the binder is a mineral binder. This leads to two not insignificant advantages: hydrophilicity allows perfect wetting by the water that may be deposited on the film, thus making cleaning easier.

In conjunction with hydrophilicity, the film may also exhibit oleophilicity, allowing the "wetting" of organic soiling matter which, as in the case of water, then tends to be deposited on the film in the form of a continuous layer less visible than well-localized "stains". Thus, an "organic antisoiling" effect is obtained that takes place in two steps: as soon as it is deposited on the film, the soiling is already barely visible. Then, progressively, said soiling disappears by photocatalytically initiated radical degradation.

The thickness of the film can vary between a few nanometers and a few microns, typically between 50 nm and 10 µm.

In fact, the choice of thickness may depend on various parameters, especially the envisioned application of the substrate, or else on the size of the $TiO_2$ crystallites in the film. The film may also be chosen to have a relatively smooth surface—this is because a low surface roughness may be advantageous if it allows a larger active photocatalytic area to develop. However, too pronounced a roughness may be detrimental, by promoting the incrustation and accumulation of dirt.

According to another variant, the functionality provided on the other face of the substrate may be formed by an antireflection film.

Given below are the preferred ranges of the geometric thicknesses and indices of the four multilayer antireflection coating layers, this coating being called A:

$n_1$ and/or $n_3$ are between 2.00 and 2.30, especially between 2.15 and 2.25 and preferably close to 2.20;

$n_2$ and/or $n_4$ are between 1.35 and 1.65;

$e_1$ is between 5 and 50 nm, especially between 10 and 30 nm, or between 15 and 25 nm;

$e_2$ is between 5 and 50 nm, especially equal to or less than 35 nm or 30 nm, being in particular between 10 and 35 nm;

$e_3$ is between 40 and 180 nm and preferably between 45 and 150 nm; and $e_4$ is between 45 and 110 nm and preferably between 70 and 105 nm.

The most appropriate materials for forming the first and/or third layers of the antireflection multilayer coating A, namely those having a high index, are based on a mixed silicon zirconium nitride or on a mixture of these nitrides. As a variant, these high-index layers are based on mixed silicon tantalum nitrides or a mixture of these nitrides. All these materials may be optionally doped so as to improve their chemical and/or mechanical and/or electrical resistance properties.

The most appropriate materials for forming the second and/or fourth layers of the multilayer coating A, namely those having a low index, are based on silicon oxide, silicon oxynitride and/or silicon oxycarbide or else based on a mixed silicon aluminum oxide. Such a mixed oxide tends to have better durability, especially chemical durability, than pure $SiO_2$ (an example of this is given in the patent EP 791 562). The respective proportion of the two oxides may be adjusted in order to improve the expected durability without excessively increasing the refractive index of the layer.

A preferred embodiment of this antireflection multilayer coating is of the form: substrate/$Si_3N_4$/$SiO_2$/$Si_3N_4$/$SiO_2$.

It goes without saying that the invention is applicable in the same way to systems using light-emitting systems other than those described in the examples.

The invention claimed is:

1. A substrate with electrode for an organic light-emitting device, comprising:
    a substrate; and
    a multilayer bottom electrode formed on a first main face of the substrate;
    wherein:
    the multilayer bottom electrode comprises the following layers provided in succession on the first main face of the substrate:
        a contact layer comprising at least one of a metal oxide and a metal nitride;
        a metallic functional layer comprising silver, said metallic functional layer having intrinsic electrical conductivity properties and a thickness of between 3 and 20 nm;
        a thin blocking layer; and
        an overlayer forming a work function matching layer comprising at least one metal oxide selected from the group consisting of indium oxide, zinc oxide, tin oxide, Sb-doped tin oxide, zinc oxide doped with Al, zinc oxide doped with Ga, a mixed indium tin oxide, a mixed indium zinc oxide, and a mixed zinc tin oxide;
    and further wherein:
    the thin blocking layer is provided directly on the metallic functional layer; and
    the thin blocking layer comprises at least one of:
        a metallic thin blocking layer having a thickness of 5 nm or less comprising at least one optionally partially oxidized metal selected from the group consisting of Ti, Ni and Cr; and
        a layer having a thickness of 10 nm or less comprising a substoichiometric metal oxide, a substoichiometric metal oxynitride, or a substoichiometric metal nitride where said metal is chosen from at least one of the following metals: Ti, Ni and Cr.

2. The substrate with electrode as claimed in claim 1, further comprising a barrier layer, wherein:
    the barrier layer is between the thin blocking layer and the overlayer;
    the barrier layer comprises at least one metal oxide selected from the group consisting of indium oxide, zinc oxide, tin oxide, aluminum oxide, titanium oxide, zirconium oxide, tantalum oxide, and silicon oxide.

3. The substrate with electrode as claimed in claim 1, wherein the overlayer has a thickness of 20 nm or more.

4. The substrate with electrode as claimed in claim 2, wherein:

the contact layer and the barrier layer each comprise an optionally Al-doped zinc; and
the overlayer comprises a mixed indium tin oxide.

5. The substrate with electrode as claimed in claim 1, wherein:
the multilayer bottom electrode has a light transmission $T_L$ of 70% or more, and a sheet resistance of 10Ω/□ or less when the metallic functional layer has a thickness of 6 nm or more.

6. The substrate with electrode as claimed in claim 1, wherein the metallic functional layer comprises (1) pure silver or (2) silver alloyed or doped with Au, Pd, Al, Pt, Cu, Zn, Cd, In, Si, Zr, Mo, Ni, Cr, Mg, Mn, Co, or Sn.

7. The substrate with electrode as claimed in claim 1, wherein:
the contact layer comprises at least one metal oxide selected from the group consisting of optionally doped chromium oxide, optionally doped indium oxide, optionally doped and optionally substoichiometric zinc oxide, optionally doped aluminum oxide, optionally doped titanium oxide, optionally doped molybdenum oxide, optionally doped zirconium oxide, optionally doped antimony oxide, optionally doped tin oxide, optionally doped tantalum oxide, optionally doped silicon oxide, doped zinc oxide, and mixed oxides thereof; and
the contact layer has a thickness of between 3 and 30 nm.

8. The substrate with electrode as claimed in claim 1, further comprising a thin blocking lower layer in direct contact with the contact layer and the metallic functional layer, wherein:
the thin blocking layer comprises at least one of
a layer of a substoichiometric metal oxide, nitride, or oxynitride having a thickness of 10 nm or less; and
a layer of a metal having a thickness of 5 nm or less.

9. The substrate with electrode as claimed in claim 1, further comprising a base layer, wherein:
the base layer is provided between the substrate and the contact layer;
the base layer is capable of forming a barrier to alkali metals;
the base layer comprises optionally doped silicon oxide, optionally doped silicon oxycarbide, optionally doped silicon nitride, optionally doped silicon oxynitride, or optionally doped silicon oxycarbonitride; and
the base layer has a thickness of between 10 and 150 nm.

10. The substrate with electrode as claimed in claim 9, wherein:
the substrate with electrode further comprises a wet-etch stop layer between the base layer and the contact layer, or the base layer comprises the wet-etch stop layer;
the wet-etch stop layer comprises tin and silicon nitride, silicon oxide, or silicon oxycarbide.

11. The substrate with electrode as claimed in claim 9, wherein:
the base layer substantially covers the first main face of the substrate; and
the contact layer, the metallic functional layer, the thin blocking layer, and the overlayer are obtained by etching with a single etching pattern in a single wet etching operation.

12. The substrate with electrode as claimed in claim 1, wherein a substructure including the contact layer, the metallic functional layer, and the thin blocking layer is repeated at least once between the substrate and the overlayer.

13. The substrate with electrode as claimed in claim 1, wherein the substrate comprises soda-lime-silicon glass.

14. The substrate with electrode as claimed in claim 1, wherein:
the substrate with electrode further comprises a functional film provided on a second main face of the substrate;
the functional film comprises an antireflection multilayer, an antifogging or antisoiling layer, an ultraviolet filter, a phosphor layer, a mirror layer, or a light extraction scattering zone.

15. An organic light-emitting device, comprising:
at least one organic light-emitting layer provided between the substrate with electrode according to claim 1 and a top electrode.

16. The organic light-emitting device as claimed in claim 15, wherein the device is provided in a single glazing unit, a double glazing unit, or a laminated glazing unit.

17. The organic light-emitting device as claimed in claim 15, comprising a plurality of adjacent organic light-emitting systems, wherein each of the systems:
emits white light; or
comprises a red light-emitting system, a green light-emitting system, and a blue light-emitting system, the systems being connected in series.

18. The organic light-emitting device as claimed in claim 15, wherein:
the device comprises one or more reflective or transparent luminous surfaces, or is in the form of an indicating display panel; and
the device produces at least one of uniform light and differentiated luminous zones differentiated by guided light extraction in the substrate.

19. The organic light-emitting device as claimed in claim 15, wherein the device is configured for use in at least one of buildings, transport vehicles, urban or professional furniture, interior furnishings, backlighting of electronic equipment, and illuminating mirrors.

20. The substrate with electrode as claimed in claim 1, wherein the overlayer comprises at least one metal oxide selected from the group consisting of:
metal oxides selected from the group consisting of a mixed indium tin oxide and a mixed indium zinc oxide.

21. The substrate with electrode as claimed in claim 1, wherein:
the contact layer comprises at least metal oxide selected from the group consisting of optionally doped and optionally substoichiometric zinc oxide, tin oxide, and mixed tin zinc oxide; and
the contact layer has a thickness of between 3 and 30 nm.

22. The substrate with electrode as claimed in claim 1, wherein the thin blocking layer comprises a metal chosen from Ti, Cr and Ni, or based on an alloy formed from at least two of these metals, having a thickness of 5 nm or less.

23. The substrate with electrode as claimed in claim 1, wherein the thin blocking layer comprises optionally partially oxidized Ti or NiCr having a thickness of 5 nm or less.

24. The substrate with electrode as claimed in claim 1, wherein the thin blocking layer is optionally partially oxidized Ti having a thickness of 5 nm or less.

25. The substrate with electrode as claimed in claim 1, wherein the thin blocking layer has a thickness between 0.5 and 2 nm.

26. The substrate with electrode as claimed in claim 1, wherein the thin blocking layer is directly under a layer comprising at least one metal oxide.

27. The substrate with electrode as claimed in claim 1, wherein the thin blocking layer is directly under a layer comprising at least one metal oxide selected from the group consisting of zinc oxide doped with Al, zinc oxide doped with Ga, and mixtures thereof.

28. The substrate with electrode as claimed in claim 1, wherein the thin blocking layer is directly under the overlayer.

29. The substrate with electrode as claimed in claim 1, wherein the thin blocking layer is directly under the overlayer which comprises at least one oxide selected from the group consisting of a mixed indium tin oxide, a mixed indium zinc oxide, and mixtures thereof.

* * * * *